US006482685B1

(12) United States Patent
Chen et al.

(10) Patent No.: US 6,482,685 B1
(45) Date of Patent: Nov. 19, 2002

(54) METHOD FOR FABRICATING A LOW TEMPERATURE POLYSILICON THIN FILM TRANSISTOR INCORPORATING MULTI-LAYER CHANNEL PASSIVATION STEP

(75) Inventors: Chih-Chiang Chen, Hsinchu (TW); Kun-Chih Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/037,014

(22) Filed: Dec. 31, 2001

(51) Int. Cl.[7] ............................................. H01L 29/786
(52) U.S. Cl. ...................... 438/162; 438/166; 438/163
(58) Field of Search ................... 438/162, 166, 438/487, 148, 50, 238, 161, 542, 558, 163, 563, 564, 154; 257/347, 350, 354, 635

(56) References Cited

U.S. PATENT DOCUMENTS

| | | | | |
|---|---|---|---|---|
| 5,326,726 A | * | 7/1994 | Tsang et al. ................ 438/330 |
| 5,620,931 A | * | 4/1997 | Tsang et al. .................... 216/2 |
| 5,767,930 A | * | 6/1998 | Kobayashi et al. .......... 257/408 |
| 5,773,329 A | * | 6/1998 | Kuo ..................... 148/DIG. 16 |
| 5,827,760 A | * | 10/1998 | Seo ............................. 438/161 |
| 6,018,182 A | * | 1/2000 | Morosawa ................... 257/347 |
| 6,146,930 A | * | 11/2000 | Kobayashi et al. .......... 438/154 |
| 6,207,481 B1 | * | 3/2001 | Yi et al. ........................ 257/66 |

* cited by examiner

*Primary Examiner*—Olik Chaudhuri
*Assistant Examiner*—Laura M Schillinger
(74) *Attorney, Agent, or Firm*—Tung & Associates

(57) ABSTRACT

A method for fabricating a low temperature polysilicon thin film transistor incorporating a multi-layer channel passivation stack, and for activating dopant ions in a polysilicon gate in the TFT structure has been described. In the method, a multi-layer channel passivation stack consisting of a first insulating material layer, a metal layer and a second insulating material layer are first deposited on a polysilicon gate to shield a channel region in the gate during a laser irradiation process for activating the dopant ions in the gate. Any damages to the channel region of the polysilicon gate by the laser irradiation or the rapid thermal annealing step can be avoided, as well as the dopant impurity out-diffusion and lateral diffusion problems.

7 Claims, 3 Drawing Sheets

METHOD FOR FABRICATING A LOW TEMPERATURE POLYSILICON THIN FILM TRANSISTOR INCORPORATING MULTI-LAYER CHANNEL PASSIVATION STEP

FIELD OF THE INVENTION

The present invention generally relates to a method for fabricating a thin film transistor and more particularly, relates to a method for fabricating a low temperature polysilicon thin film transistor that incorporates a multi-layer channel passivation step.

BACKGROUND OF THE INVENTION

In recent years, large liquid crystal cells have been used in flat panel displays. The liquid crystal cells are normally constructed by two glass plates joined together with a layer of a liquid crystal material sandwiched in-between. The glass substrates have conductive films coated thereon with at least one of the substrates being transparent. The substrates are connected to a source of power to change the orientation of the liquid crystal material. A possible source of power is a thin film transistor that is used to separately address areas of the liquid crystal cells at very fast rates. The TFT driven liquid crystal cells can be advantageously used in active matrix displays such as for television and computer monitors.

As the requirements for resolution of liquid crystal monitors increase, it becomes desirable to address a large number of separate areas of a liquid crystal cell, called pixels. For instance, in a modern display panel, more than 3,000,000 pixels may be present. At least the same number of transistors must therefore be formed on the glass plates so that each pixel can be separately addressed and left in the switched state while other pixels are addressed.

Thin film transistors are frequently made with either a polysilicon material or an amorphous silicon material. For TFT structures that are made of amorphous silicon material, a common structure is the inverted staggered type which can be back channel etched or tri-layered. The performance of a TFT and its manufacturing yield or throughput depend on the structure of the transistor. For instance, the inverted staggered back channel etched TFT can be fabricated with a minimum number of six masks, whereas other types of inverted staggered TFT require a minimum number of nine masks. The specification for a typical inverted staggered back channel etched TFT includes an amorphous silicon that has a thickness of 3,000 Å, a gate insulator of silicon nitride or silicon oxide, a gate line of Mo/Ta, a signal line of Al/Mo and a storage capacitor. The requirement of a thick amorphous silicon layer in the TFT device is a drawback for achieving a high yield fabrication process since deposition of amorphous silicon is a slow process. A major benefit for the amorphous silicon TFT is its low leakage current which enables a pixel to maintain its voltage. On the other hand, an amorphous silicon TFT has the drawback of a low charge current (or on current) which requires an excessive amount of time for a pixel to be charged to its required voltage.

FIG. 1 shows an enlarged, cross-sectional view of a conventional amorphous silicon TFT structure. Amorphous TFT 10 is built on a low cost glass substrate 12. On top of the glass substrate 12, a gate electrode 14 is first deposited of a refractory metal such as Cr, Al or Al alloy and then formed. A gate insulating layer 16 is normally formed in an oxidation process. For instance, a high density $TaO_x$ on a Ta gate can be formed to reduce defects such as pin holes and to improve yield. Another gate insulating layer 20 is then deposited of either silicon oxide or silicon nitride. An intrinsic amorphous silicon layer 22 is then deposited with a $n^+$ doped amorphous silicon layer 24 deposited on top to improve its conductivity. Prior to the deposition of the doped amorphous silicon layer 24, an etch stop 26 is first deposited and formed to avoid damages to the amorphous silicon layer 22 in a subsequent etch process for a contact hole. The doped amorphous silicon layer 24 is formed by first depositing the amorphous silicon layer in a chemical vapor deposition process and then implanting ions in an ion implantation process. Boron ions are normally used to achieve $n^+$ polarity. A drain region 30 and a source region 32 are then deposited and formed with a pixel electrode layer 34 of ITO (indium-tin-oxide) material deposited and formed on top. The drain region 30 and the source region 32 are normally deposited of a conductive metal layer. A suitable conductive metal may be a bilayer of Cr/Al. The structure is then passivated with a passivation layer 36.

A second conventional inverted staggered type TFT 40 is shown in FIG. 2. The TFT 40 is frequently called the back channel etched type inverted staggered TFT. A gate electrode 42 is first formed on a non-conducting glass substrate 38. The gate electrode 42 is connected to a gate line (not shown) laid out in the row direction. A dielectric material layer 44 of either silicon oxide or silicon nitride is used to insulate the gate electrode 42. After an amorphous silicon layer 46 and a contact layer 48 are sequentially deposited, patterned and etched, source electrode 50 and drain electrode 52 are formed to provide a channel 54 in-between the two electrodes, hence the name back channel etched TFT. The source electrode 50 of each TFT is connected to a transparent pixel electrode 56 independently formed in the area surrounded by the gate lines and the drain lines (not shown). A transparent passivation layer 58 of a material such as silicon nitride is deposited on the completed structure.

As shown in FIG. 2, the gate electrode 42 is frequently formed of chromium or other similar metals on the transparent glass substrate 38. The dielectric layer 44 of gate oxide or silicon nitride is formed to insulate the upper surface of the glass substrate 38 including the top surface of the gate electrode 42. A semi-conducting layer 46, which may be formed of amorphous silicon is stacked on the dielectric film 44 over the gate electrode 42. The drain electrode 52 and the source electrode 50 are formed on the semi-conducting film 46 and are separated from each other by a predetermined distance forming the channel section 54. The two electrodes each has a contact layer of 48 and a metal layer which are electrically connected to the semi-conducting layer 46. The transparent electrode 44 may be formed of ITO.

A second type of TFT is made by using a polysilicon material. Polysilicon is more frequently used for displays that are designed in a smaller size, for instance, up to three inch diagonal for a projection device. At such a small size, it is economical to fabricate the display device on a quartz substrate. Unfortunately, large area display devices cannot be made on quartz substrates. The desirable high performance of polysilicon can be realized only if a low temperature process can be developed to enable the use of non-quartz substrates. For instance, in a recently developed process, large area polysilicon TFT can be manufactured at processing temperatures of less than 600° C. In the process, self-aligned transistors are made by depositing polysilicon and gate oxide followed by source/drain regions which are self-aligned to the gate electrode. The device is then completed with a thick oxide layer, an ITO layer and aluminum contacts.

Polysilicon TFTs have the advantage of a high charge current (or on current) and the drawback of a high leakage current. It is difficult to maintain the voltage in a pixel until the next charge in a polysilicon TFT due to its high leakage current. Polysilicon also allows the formation of CMOS devices, which cannot be formed by amorphous silicon. For the fabrication of larger displays, a higher mobility may be achieved by reducing the trap density around the grain boundaries in a hydrogenation process.

When compared to the amorphous silicon thin film transistors, the low temperature polysilicon TFTs have higher mobility and higher drive current. However, due to the fabrication technology and the structure of the polysilicon element, the activation process (or the annealing process) for the dopant ions in the source area and the drain area has become an important issue. For instance, FIG. 3 illustrates a conventional method for an activation process for a polysilicon island 60. The polysilicon island 60 is constructed by a polysilicon layer 62 with a photoresist layer 64 patterned on top to cover a channel section 66 of the polysilicon island 62. However, in this conventional method for activating the dopant ions, i.e. $N^+$ dopant ions by either laser irradiation or by rapid thermal annealing (RTA), several process disadvantages have been encountered. For instance, a direct contact of the photoresist layer 64 with the polysilicon layer 62 causes contamination to the polysilicon by residual photoresist material left behind after a photoresist removal process. Moreover, other processing difficulties such as dopant out-diffusion and dopant lateral diffusion have been encountered. The conventional method for dopant activation, therefore, must be improved before it can be used to produce high quality thin film transistors.

It is therefore an object of the present invention to provide a method for fabricating a low temperature polysilicon thin film transistor that does not have the drawbacks or the shortcomings of the conventional method.

It is another object of the present invention to provide a method for fabricating a low temperature polysilicon thin film transistor that incorporates multi-layer channel passivation step.

It is a further object of the present invention to provide a method for fabricating a low temperature polysilicon thin film transistor in which dopant ions are activated by laser irradiation without causing damages to a channel region.

It is another further object of the present invention to provide a method for activating dopant ions in a polysilicon gate in a thin film transistor by depositing a multi-layer passivation layer on top of a channel region of a polysilicon gate prior to a laser activation step.

It is still another object of the present invention to provide a method for activating dopant ions in a polysilicon gate in a TFT by first depositing a first insulating material layer, a metal layer and a second insulating material layer on top of a polysilicon gate to shield a channel region during a laser activation process.

It is yet another object of the present invention to provide a method for activating dopant ions in a polysilicon gate in a TFT structure wherein dopant ions in both a NMOS and a PMOS are activated simultaneously in the same step.

SUMMARY OF THE INVENTION

In accordance with the present invention, a method for fabricating a low temperature polysilicon thin film transistor that incorporates a multi-layer channel passivation step is provided.

In a preferred embodiment, a method for activating dopant ions in a polysilicon gate in a thin film transistor utilizing multi-layer channel passivation can be carried out by the operating steps of first providing a substrate; forming a polysilicon island on the substrate; depositing a first insulating material layer overlying the polysilicon island; depositing a metal layer overlying the first insulating material layer; depositing a second insulating material layer overlying the metal layer; depositing a photoresist layer on top of the second insulating material layer and patterning the photoresist layer to overlie only a channel region in the polysilicon island; etching away the first insulating material layer, the metal layer, and the second insulating material layer except an area covered by the patterned photoresist layer; removing the patterned photoresist layer; doping by implantation $N^+$ and $N^-$ dopant ions into the polysilicon island except an area covered by the first and second insulating material layers and the metal layer; activating the $N^+$ and $N^-$ dopant ions in the polysilicon island by laser irradiation through the first and second insulating material layers and the metal layer situated on top; and removing the second insulating material layer.

The method for activating dopant ions in a polysilicon gate in a TFT structure utilizing multi-layer channel passivation may further include the step of depositing the second insulating material layer of a material selected from the group consisting of $SiO_2$, $Si_3N_4$ and SiON. The method may further include the step of depositing the first and second insulating material layers by a method of plasma enhanced CVD or spin-on coating. The method may further include the step of depositing the first and second insulating material layers to a thickness between about 100 Å and about 2000 Å, and preferably between about 500 Å and about 1500 Å. The method may further include the step of activating the $N^+$ and $N^-$ dopant ions by scanning the polysilicon island with an excimer laser. The method may further include the step of forming the first insulating material layer of $SiO_2$. The method may further include the step of forming the first insulting material layer to a thickness between about 500 Å and about 1500 Å. The method may further include the step of depositing the metal layer of a material selected from the group consisting of Mo, MoW, AlNd and Ta.

The present invention is further directed to a method for fabricating a low temperature polysilicon TFT which can be carried out by the operating steps of first providing a substrate; forming a polysilicon island on the substrate; depositing a first insulating material layer, a metal layer and a second insulating material layer sequentially overlying the polysilicon island; depositing a first photoresist layer on top of the second insulating material layer without contacting the polysilicon island and patterning the photoresist layer to overlie only a channel region in the polysilicon island; etching away the first insulating material layer, the metal layer and the second insulating material layer except an area covered by the patterned first photoresist layer; removing the patterned first photoresist layer; doping by implantation $N^+$ and $N^-$ dopant ions into the polysilicon island except the area covered by the patterned first photoresist layer; activating the $N^+$ and $N^-$ dopant ions in the polysilicon island by laser irradiation through the remaining first and second insulating material layers and the metal layer situated on top; and removing the remaining second insulating material layer from the polysilicon island.

The method for fabricating a low temperature polysilicon TFT may further include the step of depositing the metal layer to a thickness between about 2000 Å and about 4000 Å. The method may further include the step of depositing the first and the second insulating material layers of a material selected from the group consisting of $SiO_2$, $Si_3N_4$ and SiON.

The method may further include the step of depositing the first and second insulating material layers by a technique of PECVD or spin-on coating. The method may further include the step of depositing the first and the second insulating material layers to a thickness between about 100 Å and about 1500 Å.

The present invention is still further directed to a method for forming a polysilicon gate in a TFT structure incorporating multi-layer channel passivation step which can be carried out by the operating steps of forming a polysilicon island on a substrate; depositing a multi-layer passivation layer including a first insulating material layer on the bottom, a metal layer in the middle and a second insulating material layer on top overlying the polysilicon island; patterning a photoresist layer on the multi-layer passivation layer and forming the multi-layer passivation layer to overlap only a channel region in the polysilicon gate; implanting $N^+$ and $N^-$ dopant ions into the polysilicon gate except the channel region; irradiating the polysilicon island through the multi-layer passivation layer with laser energy to activate the $N^+$ and $N^-$ dopant ions; and removing the second insulating material layer from the polysilicon island.

The method for forming a polysilicon gate in a TFT structure that incorporates a multi-layer channel passivation step may further include the step of forming the first and second insulating material layers from a material selected from the group consisting of $SiO_2$, $Si_3N_4$ and SiON. The method may further include the step of depositing the multi-layer passivation layer to a total thickness between about 3000 Å and about 7000 Å. The method may further include the step of depositing the first and second insulating material layers by a plasma enhanced CVD technique or by a spin-on coating technique.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The invention discloses a method for fabricating a low temperature polysilicon thin film transistor that incorporates a multi-layer channel passivation step. In the method, dopant ions in a polysilicon gate are activated by laser irradiation, while the channel region of the polysilicon island is protected by a multi-layer channel passivation layer.

The method for activating dopant ions in a polysilicon gate can be carried out by first forming polysilicon islands on a substrate, then depositing a first insulating material layer overlying the polysilicon island, followed by depositing a metal layer and a second insulating material layer sequentially on top of the polysilicon island. A photoresist layer is then deposited on top of the second insulating material layer and patterned to overlie only a channel region in the polysilicon island. The first insulating material layer, the metal layer and the second insulating material layer are then etched away except an area covered by the patterned photoresist layer. After the patterned photoresist layer is removed, a doping process by implantation of $N^+$ and $N^-$ dopant ions into the polysilicon island is carried out except the area covered by the insulating material layers. The $N^+$ and $N^-$ dopant ions are then activated in the polysilicon island by laser irradiation through the first and second insulating material layers situated on top of the island. The second insulating material layer is then removed to expose the metal line.

The invention further discloses a method for forming a polysilicon gate in a TFT structure that includes a multi-layer channel passivation stack being first formed on top of a channel region of the gate for shielding against a laser irradiation process. The multi-layer passivation stack includes a first insulating material layer, a metal layer and a second insulating material layer, with a total thickness between about 3000 Å and about 7000 Å, and preferably between about 4000 Å and about 6000 Å. The metal layer deposited may be selected from Mo, MoW, AlNd and Ta to a thickness between about 2000 Å and about 4000 Å.

The first and the second insulating material layers may be deposited of a material selected from the group consisting of $SiO_2$, $Si_3N_4$ and SiON. A suitable thickness for the first or second insulating material layer may be between about 500 Å and about 1500 Å. The insulating material layers can be deposited by either a PECVD method or by a spin-on coating method.

Figure 1:
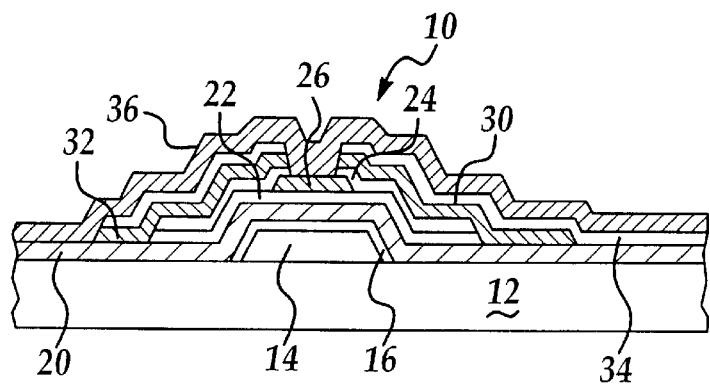
FIG. 1 is an enlarged, cross-sectional view of a conventional inverted staggered TFT structure of the tri-layered type.
Figure 2:
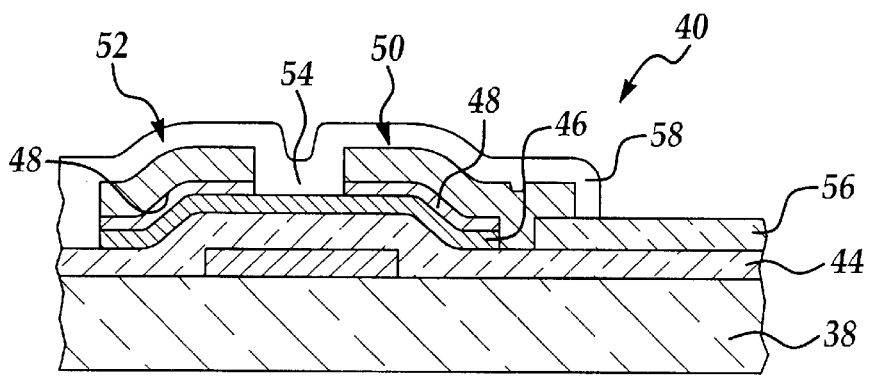
FIG. 2 is an enlarged, cross-sectional view of a conventional inverted staggered TFT structure of the back channel-etched type.
Figure 3:
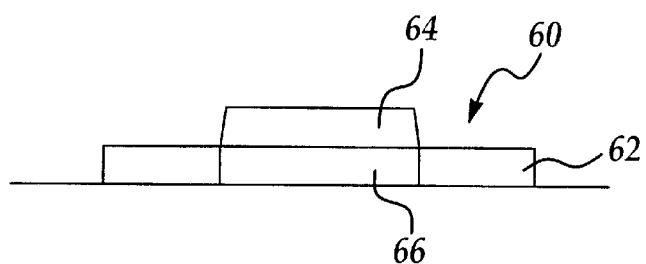
FIG. 3 is an enlarged, cross-sectional view of a polysilicon island in a TFT structure activated by a conventional method by depositing and patterning a photoresist layer over the channel region of the polysilicon island.
Figure 4A:
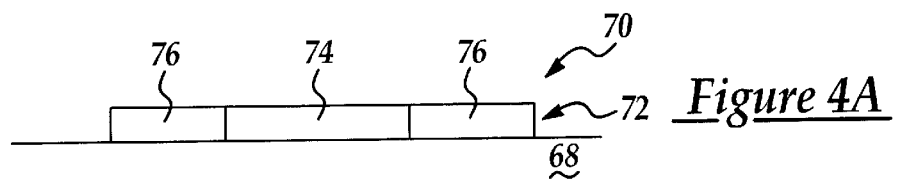
FIG. 4A is an enlarged, cross-sectional view of a preferred embodiment of the present invention TFT structure with a polysilicon island formed on a substrate.

Referring now to FIG. 4A, wherein a preferred embodiment of the present invention method for forming a TFT structure 70 is shown. The TFT structure 70 is a polysilicon gate 72 formed on a substrate 68. The polysilicon gate 72 consists of a channel region 74 and an end region 76 doped with N⁺ dopant ions.

Figure 4B:
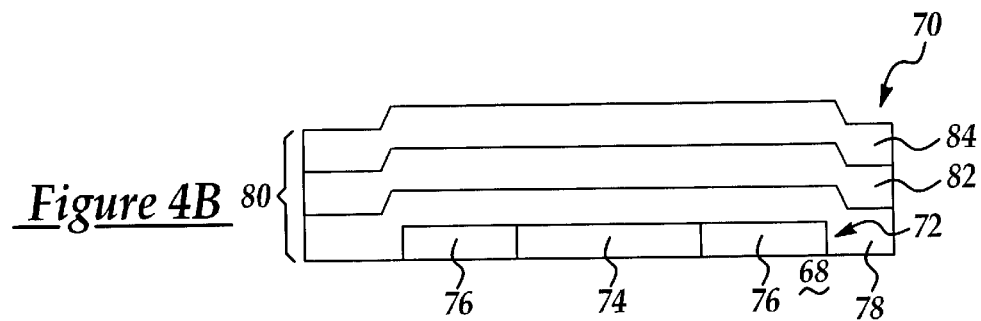
FIG. 4B is an enlarged, cross-sectional view of the present invention TFT structure of FIG. 4A with a multi-layer channel passivation layer deposited on top of the polysilicon island.

In the next step of the present invention novel method, as shown in FIG. 4B, the polysilicon gate 72 is covered with a multi-layer channel passivation stack 80. The channel passivation stack 80 consists of a first insulating material layer 78 that is immediately adjacent to the polysilicon gate 72, a middle metal layer 82 deposited on top of the first insulating material layer 78, and a second insulating material layer 84 deposited on top of the metal layer 82. The thickness for the first insulating material layer is between about 100 Å and about 2000 Å, and preferably between about 500 Å and about 1500 Å. In a preferred embodiment, a thickness of 1000 Å for the first insulating material layer formed of $SiO_2$ was utilized. Other insulating materials such as SiON and $Si_3N_4$ may also be used as the first insulating material layer 78.

Figure 4C:
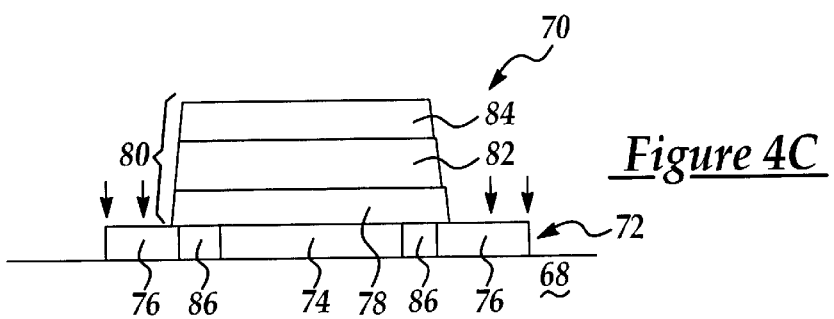
FIG. 4C is an enlarged, cross-sectional view of the present invention TFT structure of FIG. 4B with the multi-layer channel passivation layer formed by a photomask and the polysilicon island doped in an ion implantation process.

In the next step of the process, the multi-layer channel passivation stack 80 is first patterned and formed by a photoresist layer (not shown) that is patterned first on top of the stack 80. After the multi-layer channel passivation stack 80 is formed to substantially overlie the channel region 74 of the polysilicon gate 72, an ion implantation process is started to plant N⁺ and N⁻ ions into the end portions 76 of the polysilicon gate 72. The N⁻ ions are implanted into the inner portion 86 of the end portions 76. A typical commercial ion implantation apparatus may be utilized for implanting the N⁺ and N⁻ ions, for instance, by $PH_3$. The multi-layer channel passivation stack 80 shown in FIG. 4C may be formed by using a reactive ion etching technique utilizing $SF_6$ etch gas.

In the following step of the process, shown in FIG. 4D, an excimer laser of the pulse type (not shown) is utilized to irradiate the TFT structure 70 under laser energy. The excimer laser used in the preferred embodiment operates at a wave length of 308 μm, with an energy between about 200 and about 300 mJ/cm². Any suitable ions may be utilized for the implantation and to achieve the desirable implantation density.

Figure 4D:
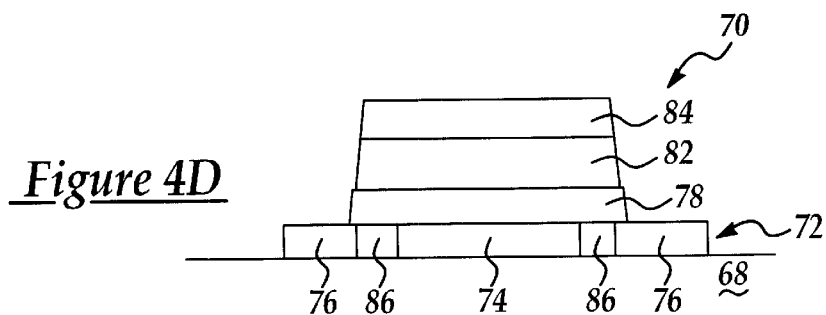
FIG. 4D is an enlarged, cross-sectional view of the TFT structure of FIG. 4C with a laser activation process executed to activated $N^+$, $N^-$ and $P^+$ ions.
Figure 4E:
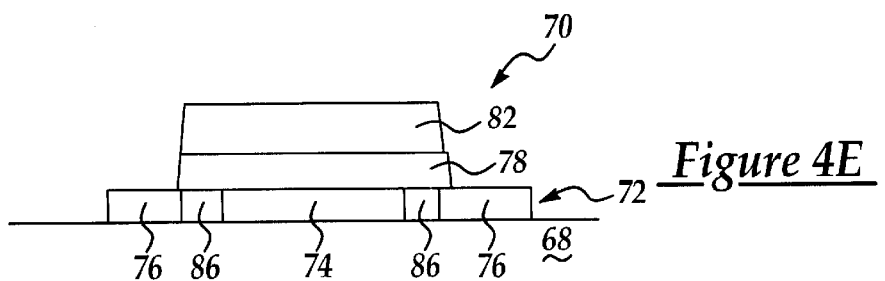
FIG. 4E is an enlarged, cross-sectional view of the present invention TFT structure of FIG. 4D with the top insulating material layer removed.
Figure 5A:
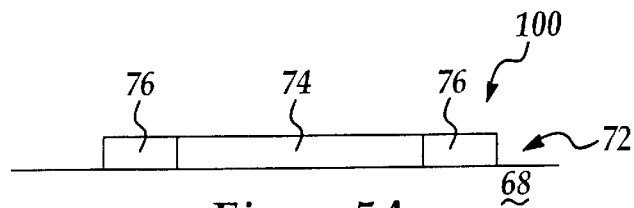
FIG. 5A is an enlarged, cross-sectional view of an alternate embodiment of the present invention TFT structure with a polysilicon island formed on a substrate.
Figure 5B:
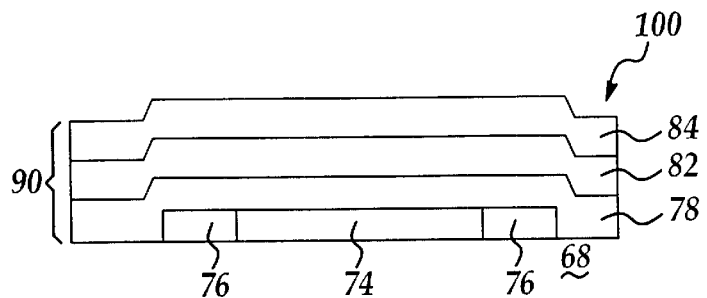
FIG. 5B is an enlarged, cross-sectional view of the present invention TFT structure of FIG. 5A with multi-layer channel passivation layers deposited on top of the polysilicon island.
Figure 5C:
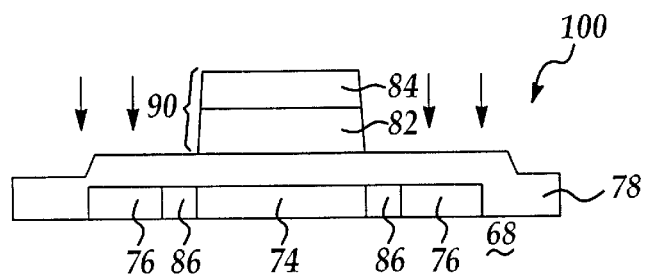
FIG. 5C is an enlarged, cross-sectional view of the present invention TFT structure of FIG. 5B with only the top two of the multi-layer channel passivation layers formed by a photomask and the polysilicon island doped in an ion implantation process.
Figure 5D:
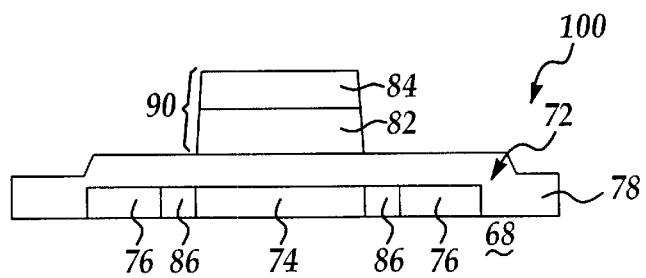
FIG. 5D is an enlarged, cross-sectional view of the TFT structure of FIG. 5C with a laser activation process executed to activated $N^+$, $N^-$ and $P^+$ ions.
Figure 5E:
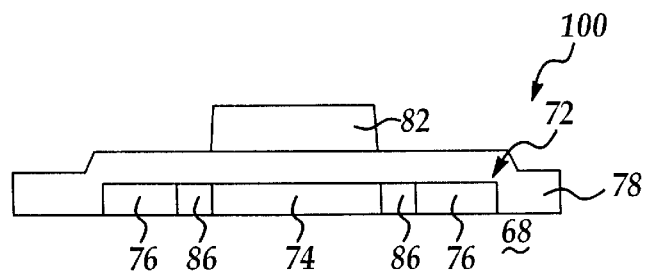
FIG. 5E is an enlarged, cross-sectional view of the present invention TFT structure of FIG. 5D with the top insulating material layer removed.

After the laser irradiation step, shown in FIG. 4D, the second insulating material layer 84 is removed in a wet stripping process by solvents containing at least BOE or BOE and HF. The TFT structure 70 is thus formed with a metal gate 82 on top.

In an alternate embodiment, shown in FIGS. 5A~5E, the first insulating material layer 78 is not removed or etched away during the formation of the channel passivation stack 90 (FIG. 5C) in the TFT structure 100. The other steps are similar to those shown in the preferred embodiment of FIGS. 4A~4E.

The present invention novel method utilized a cap oxide layer, or a multi-layer channel passivation stack to shield a channel region of a polysilicon gate such that a subsequently formed metal gate on top of the oxide cap layer does not suffer a peeling defect. Furthermore, with the multi-layer channel passivation stack shielding the channel region of the polysilicon gate, any possible damage to the gate by laser irradiation or by rapid thermal annealing can be avoided. For instance, such defects as dopant impurity out-diffusion and dopant lateral diffusion can be avoided. Another important advantage made possible by the present invention novel method is that both the NMOS and the PMOS transistors can be activated simultaneously and thus, the TFT structure produced has improved electronic properties and furthermore, improved fabrication yield.

In the present invention novel method, a polysilicon island is first formed on a substrate. A photoresist layer is then used as a hard mask to define N⁺ doping regions on the polysilicon island. The gate oxide layer (or the first insulating material layer), the metal gate layer and the cap oxide layer (the second insulating material layer) are then deposited on top of the polysilicon island and defined to the shape of the channel region of the gate by a reactive ion etching process utilizing $SF_6$ as the etchant gas. The metal 1 layer is formed from the metal gate layer and then the same photomask for the metal 1 layer is used to form the N⁻ doping regions 86 of the polysilicon gate 72. A final structure of LDD type is thus formed. By utilizing the present invention novel method of laser irradiation, the dopant ions planted in the NMOS and PMOS can be activated simultaneously in a single process.

The present invention novel method for activating dopant ions in a polysilicon gate for a TFT structure and a method for fabricating a low temperature polysilicon TFT structure that incorporates a multi-layer channel passivation stack have therefore been amply described in the above description and in the appended drawings of FIGS. 4A–5E.

While the present invention has been described in an illustrative manner, it should be understood that the terminology used is intended to be in a nature of words of description rather than of limitation.

Furthermore, while the present invention has been described in terms of a preferred and an alternate embodiment, it is to be appreciated that those skilled in the art will readily apply these teachings to other possible variations of the inventions.

The embodiment of the invention in which an exclusive property or privilege is claimed are defined as follows:

What is claimed is:

1. A method for fabricating a low temperature polysilicon TFT comprising the steps of:

providing a substrate;

forming a polysilicon island on said substrate;

depositing a first insulating material layer, a metal layer and a second insulating material layer sequentially overlying said polysilicon island;

depositing a photoresist layer on top of said second insulating material layer without contacting said polysilicon island and patterning said photoresist layer to overlie only a channel region in said polysilicon island;

etching away said first insulating material layer, said metal layer and said second insulating material layer except an area covered by said patterned first photoresist layer;

removing said patterned first photoresist layer;

doping by implanting N⁺ and N⁻ dopant ions in said polysilicon island by laser irradiation through said remaining first and second insulating material layers and said metal layer situated on top; and removing said remaining second insulating material layer from said polysilicon island.

2. A method for fabricating a low temperature polysilicon TFT according to claim 1 further comprising the step of depositing said metal layer to a thickness between about 2000 Å and about 4000 Å.

3. A method for activating dopant ions in a polysilicon gate in a TFT according to claim 1 further comprising the step of depositing said insulating material layer of a material selected from the group consisting of $SiO_2$, $Si_3N_4$ and SiON.

4. A method for activating dopant ions in a polysilicon gate in a TFT according to claim 1 further comprising the step of depositing said insulating material layer by a method of plasma enhanced chemical vapor deposition or a method of spin-on coating.

5. A method for activating dopant ions in a polysilicon gate in a TFT according to claim 1 further comprising the step of depositing said insulating material layer to a thickness between about 100 Å and about 1500 Å.

6. A method for activating dopant ions in a polysilicon gate in a TFT according to claim 1 further comprising the step of depositing said insulating material layer preferably to a thickness between about 500 Å and about 1000 Å.

7. A method for activating dopant ions in a polysilicon gate in a TFT according to claim 1 further comprising the step of activating said $N^+$ dopant ions by scanning said polysilicon island with an excimer laser.

* * * * *